(12) United States Patent
Cohen et al.

(10) Patent No.: US 10,107,860 B2
(45) Date of Patent: Oct. 23, 2018

(54) BITWISE ROTATING SCAN SECTION FOR MICROELECTRONIC CHIP TESTING AND DIAGNOSTICS

(71) Applicant: INTERNATIONAL BUSINESS MACHINES CORPORATION, Armonk, NY (US)

(72) Inventors: Todd L. Cohen, Wappingers Falls, NY (US); Mary P. Kusko, Hopewell Junction, NY (US); Hari K. Rajeev, Kerala (IN); Timothy C. Taylor, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 96 days.

(21) Appl. No.: 15/188,386

(22) Filed: Jun. 21, 2016

(65) Prior Publication Data

US 2017/0363684 A1    Dec. 21, 2017

(51) Int. Cl.
*G01R 31/3177* (2006.01)
*G01R 31/317* (2006.01)

(52) U.S. Cl.
CPC ... *G01R 31/3177* (2013.01); *G01R 31/31723* (2013.01)

(58) Field of Classification Search
CPC .......... G01R 31/3177; G01R 31/31723; G01R 31/318335; G01R 31/3185; G01R 31/2815; G01R 31/318583; H03M 13/27; G11C 2029/3202; G11C 29/32
USPC .................................. 714/726–729
See application file for complete search history.

(56) References Cited

U.S. PATENT DOCUMENTS

| | | | |
|---|---|---|---|
| 4,872,169 A | 10/1989 | Whetsel, Jr. | |
| 6,324,662 B1 | 11/2001 | Haroun et al. | |
| 6,748,564 B1 * | 6/2004 | Cullen | G01R 31/318547 714/728 |
| 6,763,488 B2 * | 7/2004 | Whetsel | G01R 31/31721 714/729 |
| 6,769,080 B2 * | 7/2004 | Whetsel | G01R 31/31721 714/729 |

(Continued)

OTHER PUBLICATIONS

R. Cantoro, M. Palena, P. Pasini and M. S. Reorda, "Test Time Minimization in Reconfigurable Scan Networks," 2016 IEEE 25th Asian Test Symposium (ATS), Hiroshima, 2016, pp. 119-124.*

(Continued)

*Primary Examiner* — Cynthia Britt
(74) *Attorney, Agent, or Firm* — Cantor Colburn LLP; Steven Meyers

(57) ABSTRACT

According to an embodiment of the present invention, a computer-implemented method for testing a microelectronic chip is described. The method may include dividing, via a processor running a scanning engine, a plurality of sections of the microelectronic chip. Each of the plurality of sections includes at least two latch sets in at least one scan chain. The method may further include determining, via the processor, based on the dividing, whether each of the plurality of sections fail a data test. The determining comprises interleaving the plurality of sections by scanning, via the processor, an alternating latch set from each scan chain in a first section, and scanning an alternating latch set from each scan chain in a second section.

20 Claims, 11 Drawing Sheets

Bitwise Rotating Scan Section

(56) References Cited

U.S. PATENT DOCUMENTS

| | | | |
|---|---|---|---|
| 7,493,539 B2* | 2/2009 | Whetsel | G01R 31/31721 714/729 |
| 7,702,980 B2 | 4/2010 | Chen | |
| 8,183,765 B2 | 5/2012 | Cok et al. | |
| 8,323,989 B2 | 12/2012 | Feustel et al. | |
| 2010/0201275 A1 | 8/2010 | Cok et al. | |
| 2016/0011262 A1* | 1/2016 | Werner | G01R 31/318563 714/727 |
| 2016/0056223 A1 | 2/2016 | Bower et al. | |
| 2016/0266202 A1* | 9/2016 | Mittal | G01R 31/3177 |

OTHER PUBLICATIONS

Kuen-Jong Lee, Tsung-Chu Haung and Jih-Jeen Chen, "Peak-power reduction for multiple-scan circuits during test application," Proceedings of the Ninth Asian Test Symposium, Taipei, 2000, pp. 453-458.*

Chillarige et al. "A Novel Failure Diagnosis Approach for Low Pin Count and Low Power Compression Architectures." Test Workshop (NATW), 2015 IEEE 24th North Atlantic. 2015.

Goel et al. "Test infrastructure design for the nexperia home platform pnx8550 system chip." Proceedings of the conference on Design, automation and test in Europe—vol. 3. IEEE Computer Society 2004.

Hansson et al., "A quantitative evaluation of a network on chip design flow for multi-core consumer multimedia applications." Design Automation for Embedded Systems 15.2 (2011) pp. 159-190.

* cited by examiner

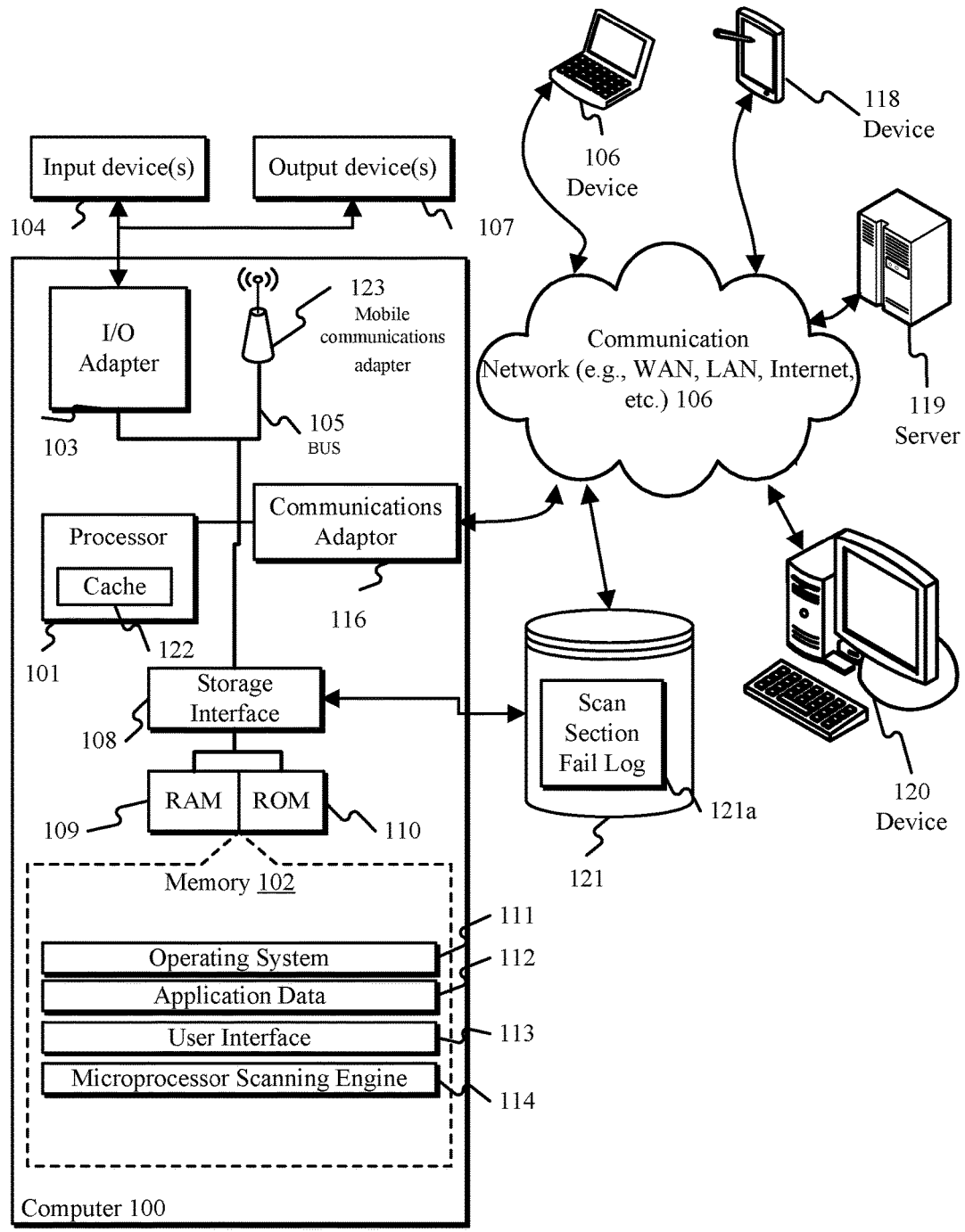
FIG. 1: Exemplary Computer

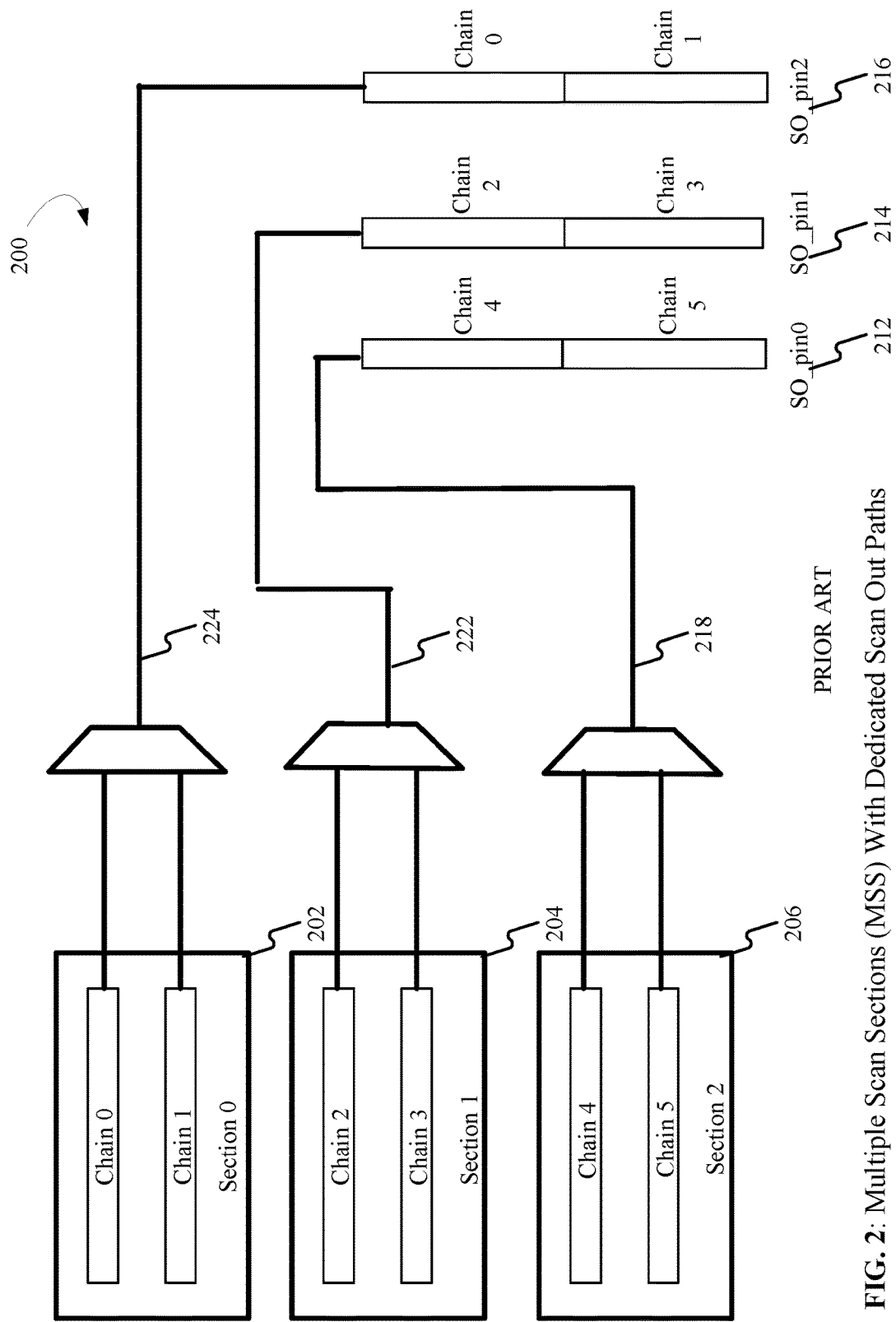
FIG. 2: Multiple Scan Sections (MSS) With Dedicated Scan Out Paths
PRIOR ART

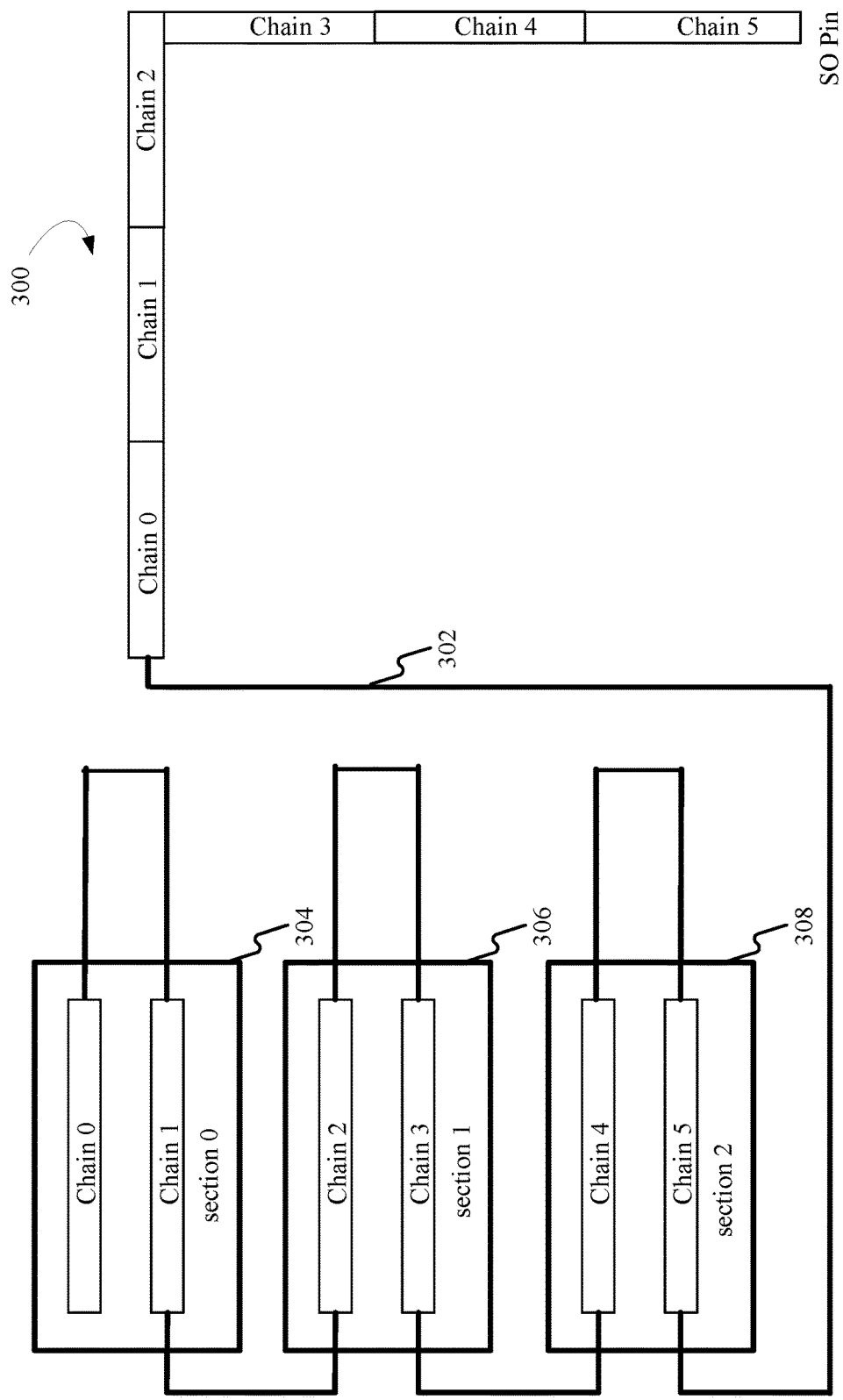
FIG. 3: Multiple Scan Sections (MSS) With a Concatenated Scan Out Path
PRIOR ART

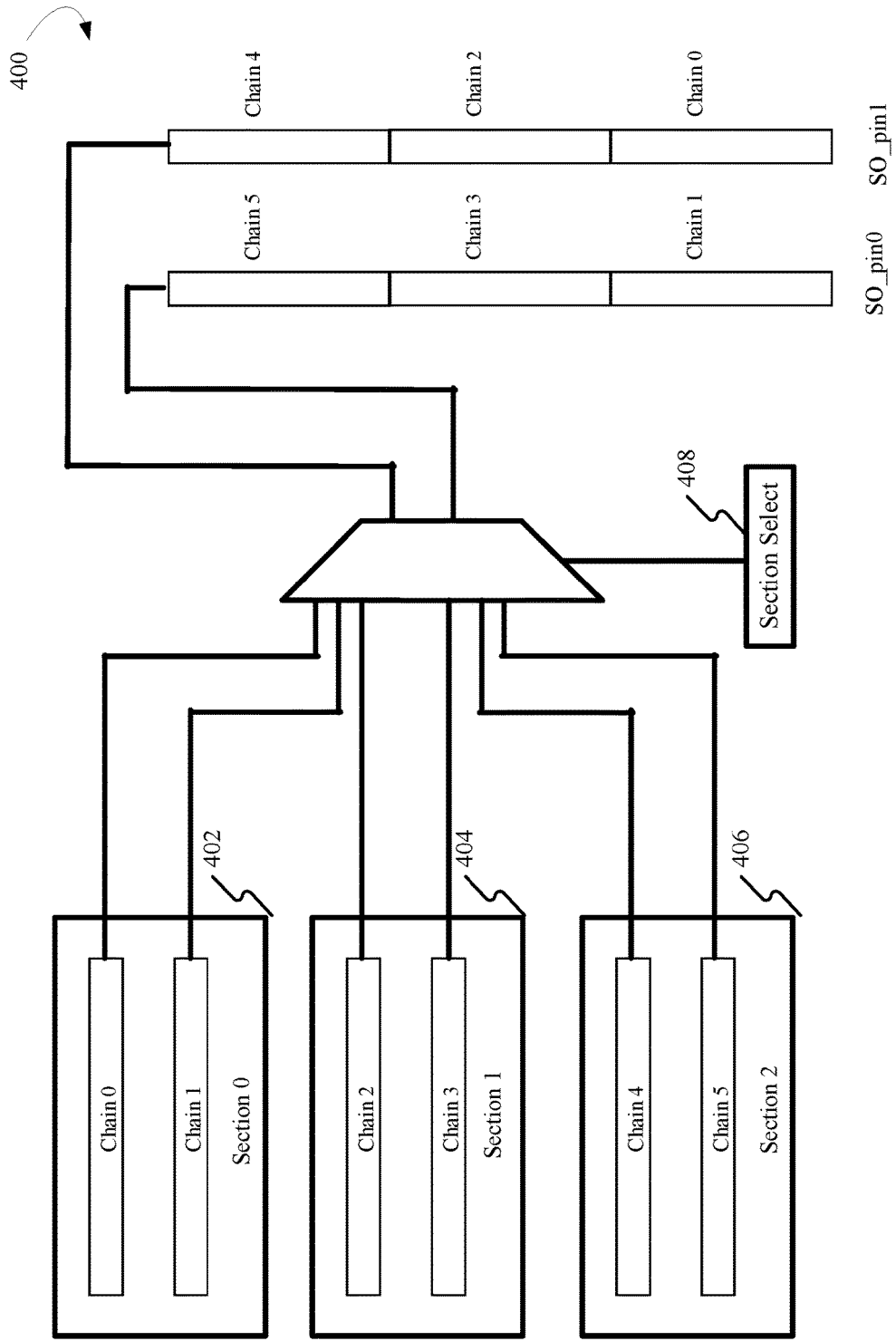
FIG. 4: System with Multiple Scan Sections (MSS) Using a Section Selection Mechanism
PRIOR ART

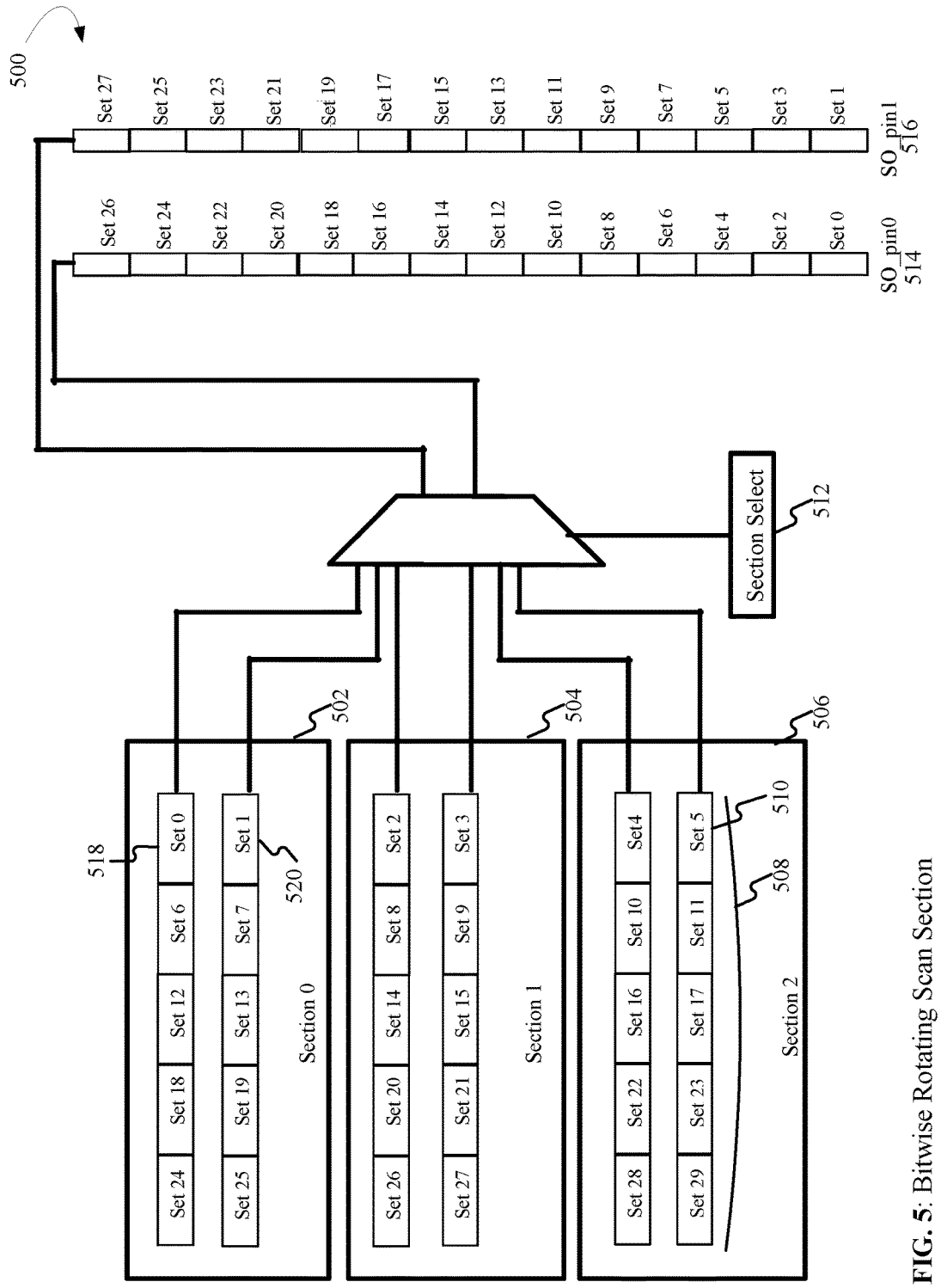
FIG. 5: Bitwise Rotating Scan Section

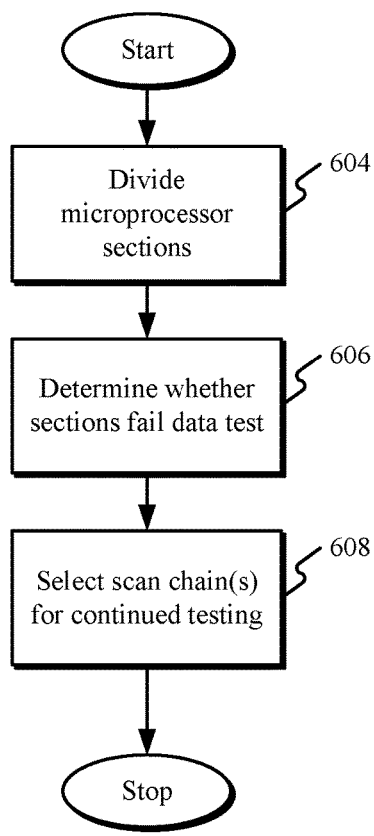
FIG. 6: Exemplary Method for Testing a Microprocessor Using a Scan Section Rotating Scan

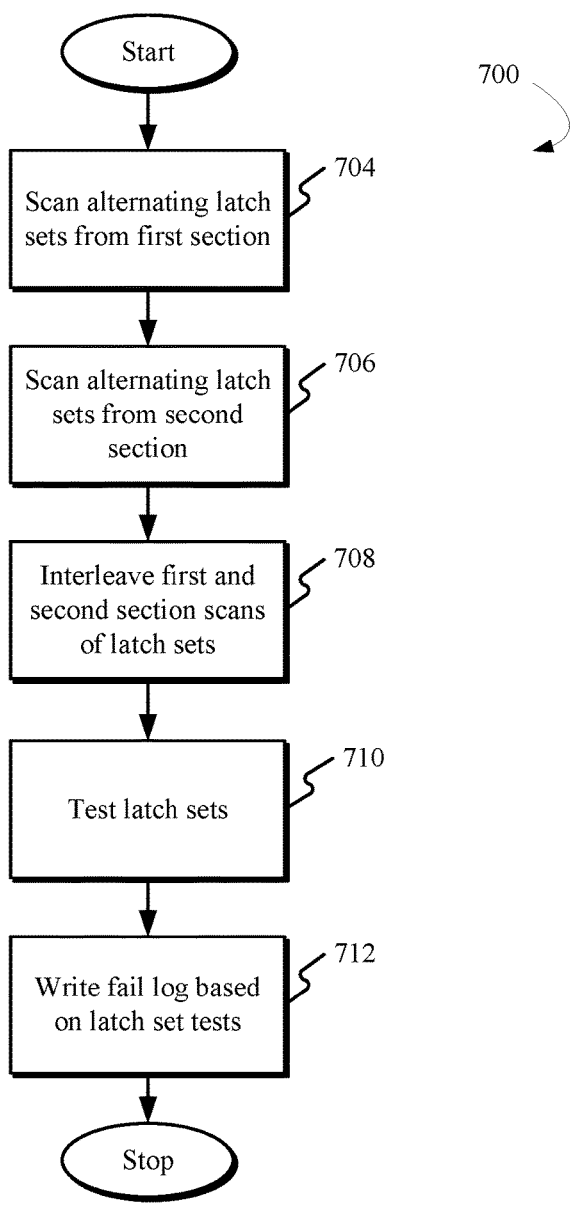
FIG. 7: Exemplary Method for Determining Whether a Section Fails a Data Test

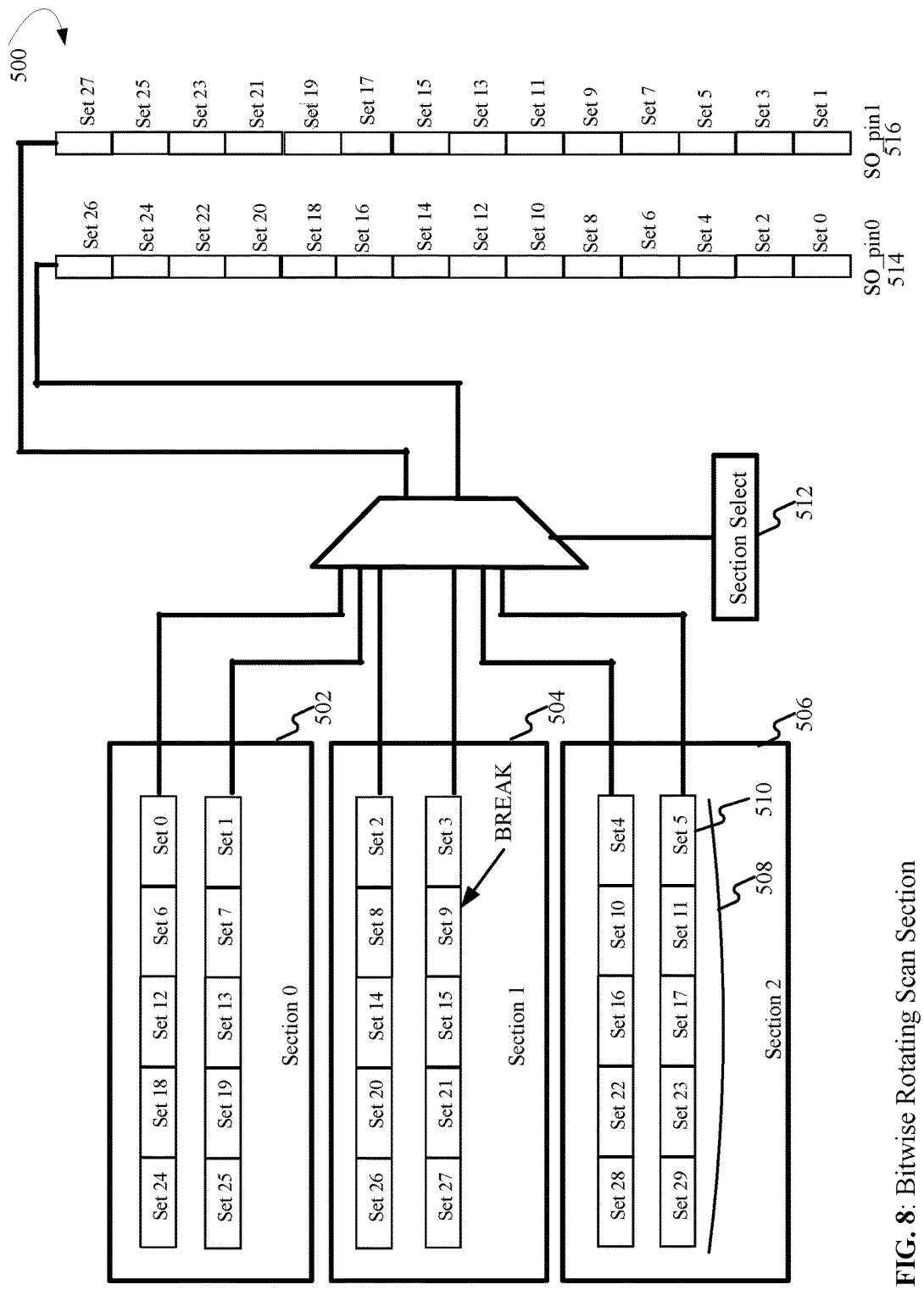
FIG. 8: Bitwise Rotating Scan Section

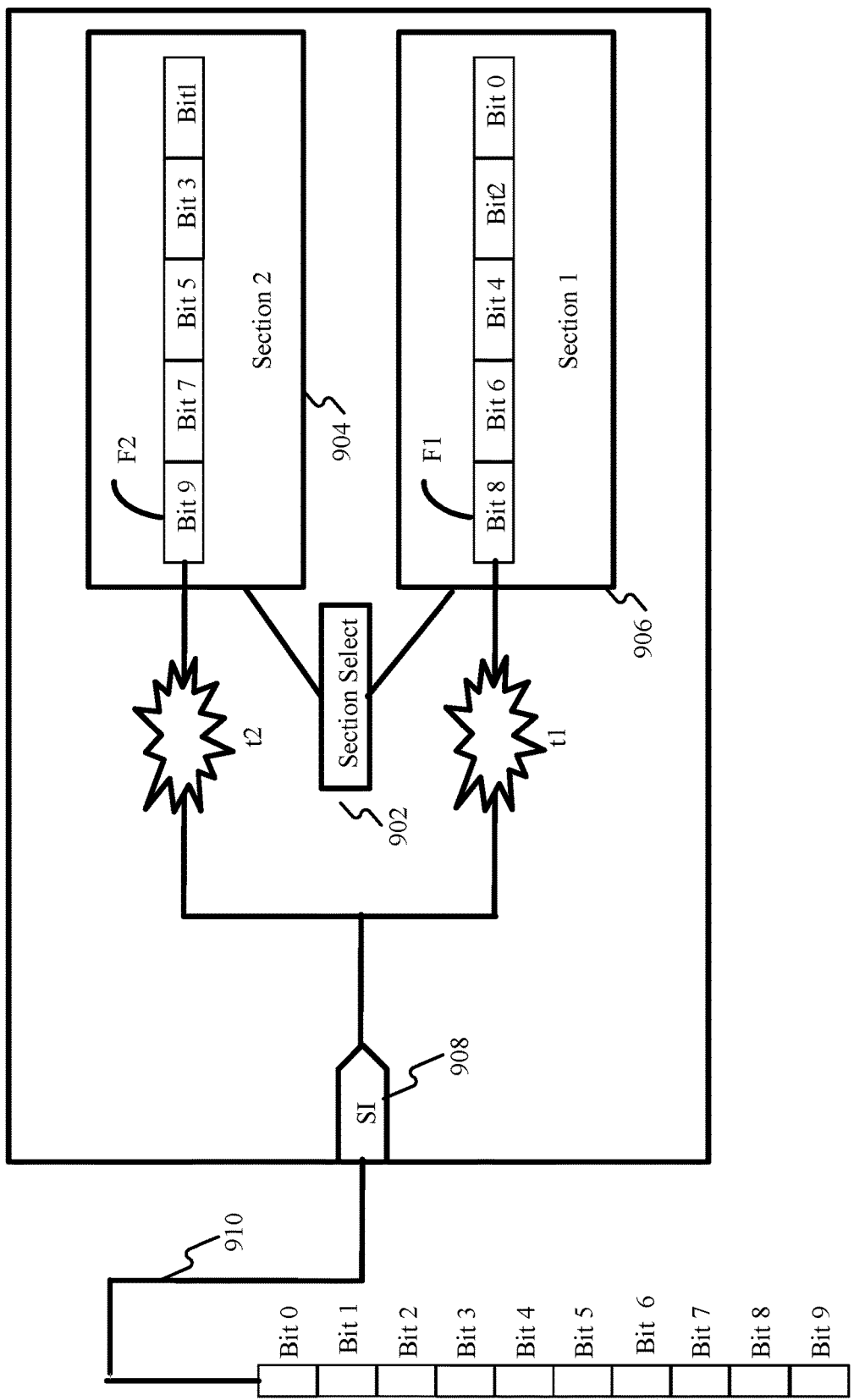
FIG. 9: Scan Section Rotation Scan Out Path

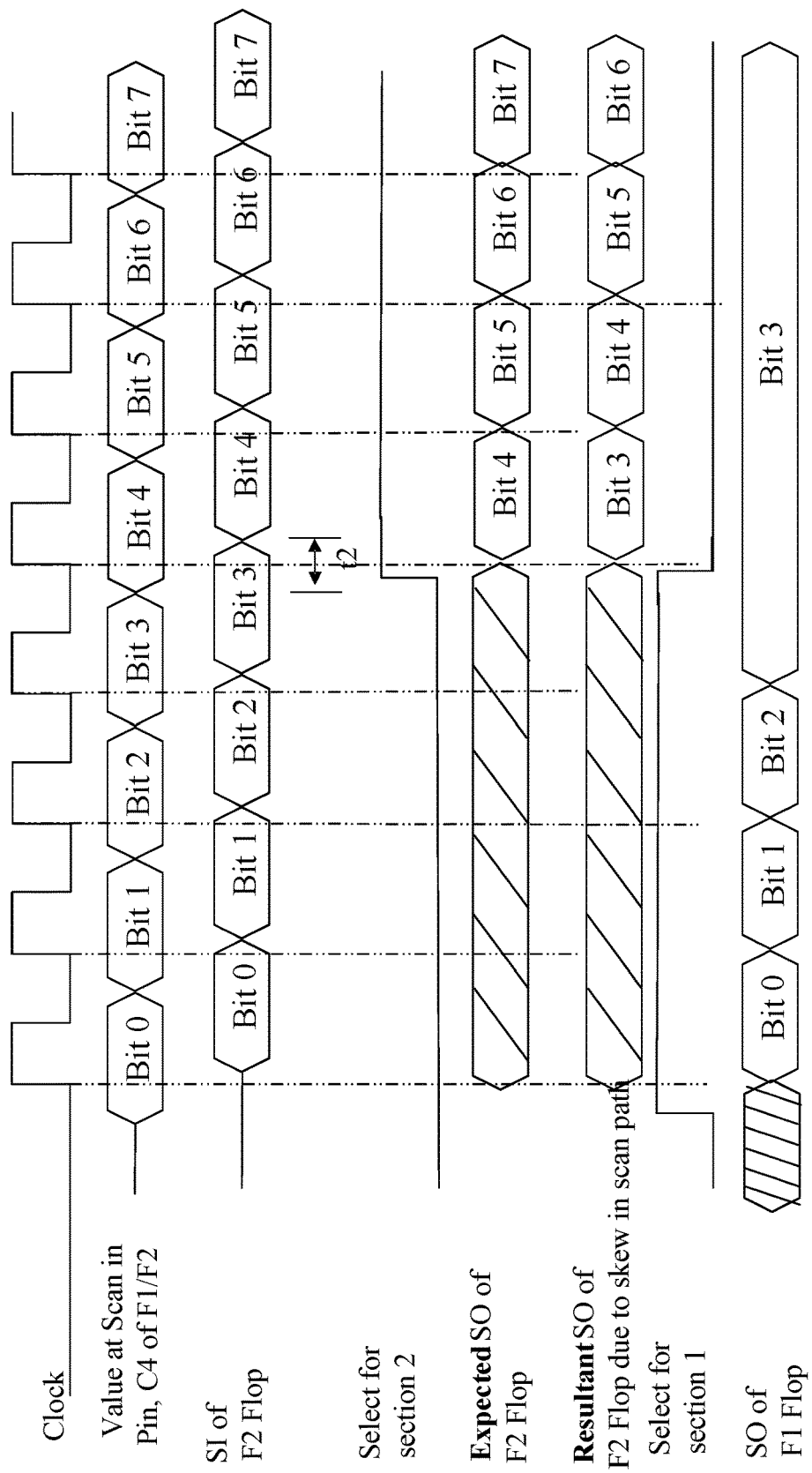
FIG. 10: Scan Timing Diagram

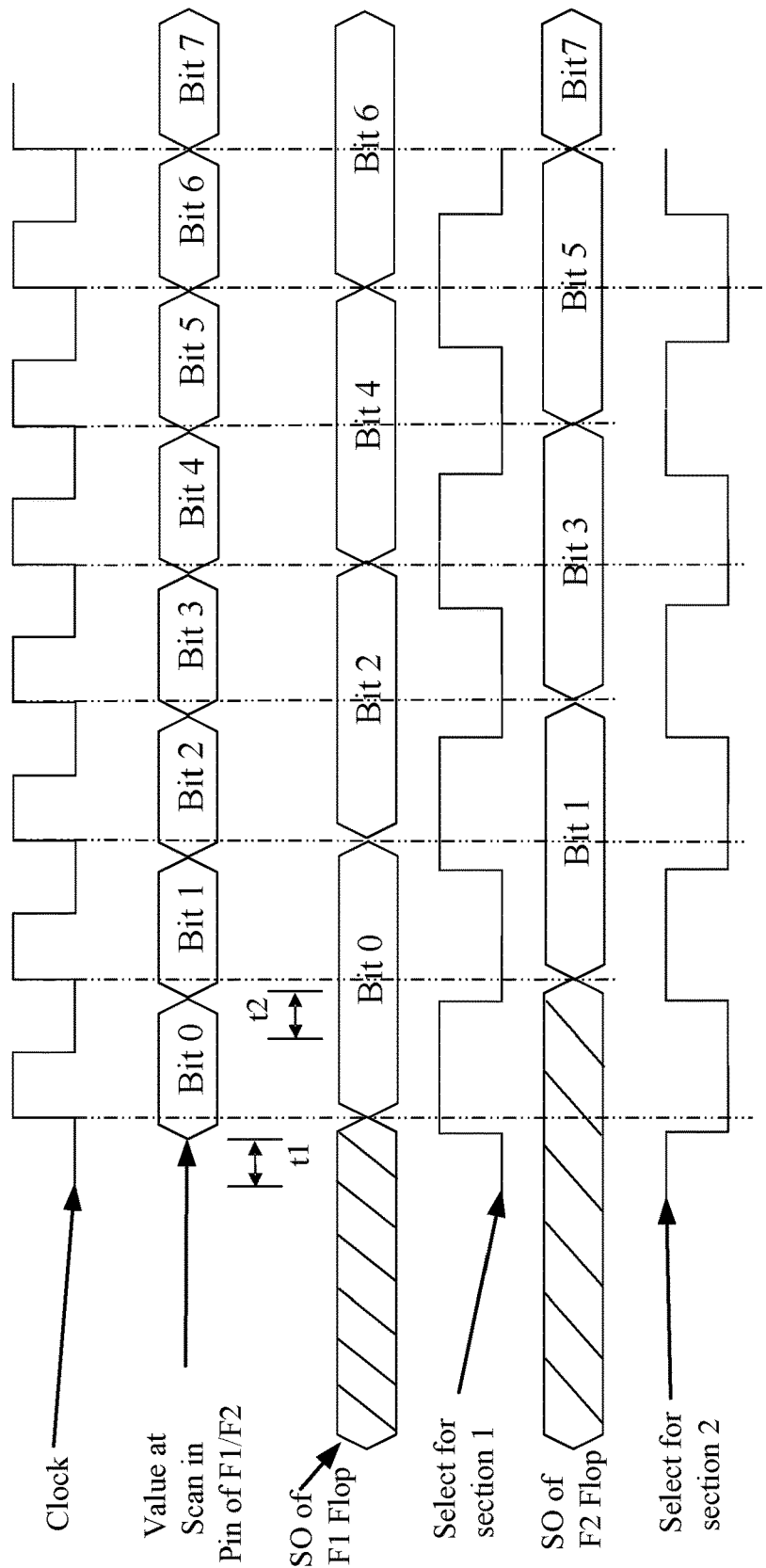
FIG. 11: Scan Timing Diagram Using Scan Engine

BITWISE ROTATING SCAN SECTION FOR MICROELECTRONIC CHIP TESTING AND DIAGNOSTICS

BACKGROUND

The present disclosure relates to microelectronic chip testing and diagnostics, and more specifically, to bitwise rotating scan section for microelectronic chip testing and diagnostics.

Today's chips are complex and typically composed of multiple sections, which are sometimes called cores. Different conventional methods exist for scanning conventional chips. One method, dedicated pin mode, uses dedicated pins for each section on a test bus. Drawbacks to dedicated pin scanning include inefficiencies caused by scan chain imbalances. Not all microelectronic sections are identical, and they can vary greatly in the number of scannable latches. For example, when using a dedicated scan bus, the scan chains may not be balanced. If 31 of the 32 channels are 100 latches long in each of the scan channels, but the 32nd channel is 1000 latches long, the chip will be scanned for 1000 cycles, there's no benefit gained from the shorter channels. Similarly, tester memory is gated by the longest channel. Manufacturing test time and tester memory is dictated by the longest scan channel. While there are drawbacks to this method when the scan chains are unbalanced there is an advantage from a diagnostics perspective. The dedicated pin can be monitored for pass/fail on the section. Fail data collection can also be easily adjusted as needed for the sections.

Another conventional method called multiple scan sections (MSS) may scan each section one at time by concatenating the sections on a single scan out pin. When a section is scanned it has full access to the scan bus. The scannable latches in the section need to be generally evenly distributed across the scan pins. Staying with the 32 wide scan bus, let's say we have a section with 3200 scannable latches and another with 32000 scannable latches. Using MSS, the section with 3200 latches would need only 100 scan clock cycles and the section with 32000 latches would need 1000 scan clock cycles. Methods using single channel MSS are limited by the amount of fail data that can be collected. When measuring one section at a time in a concatenated scan bus, the sections scanned first can fill up the fail data memory limiting data available from the scanning of subsequent sections.

When using MSS, each section is scanned in its entirety. Instead of scanning each section in its entirety, it may be advantageous to scan n number of bits from each section (for example, by dividing each scan chain into subsets, each having a predetermined number of latches), thereby sampling each latch set before scanning the whole scan chain or section. It may also be beneficial to provide methods and systems configured to perform rotational scanning using interleaving at either of the scan in or scan out busses.

SUMMARY

According to an embodiment of the present invention, a computer-implemented method for testing a microelectronic chip is described. The method may include dividing, via a processor running a scanning engine, a plurality of sections of the microelectronic chip. Each of the plurality of sections includes at least two latch sets in at least one scan chain. The method may further include determining, via the processor, based on the dividing, whether each of the plurality of sections fail a data test. The determining comprises interleaving the plurality of sections by scanning, via the processor, an alternating latch set from each scan chain in a first section, and scanning an alternating latch set from each scan chain in a second section.

According to another embodiment of the present invention, a system for testing a microelectronic chip includes a processor configured to implement a scanning engine. The scanning engine is configured to: sample a plurality of sections of the microelectronic chip. Each of the plurality of sections includes at least one latch set in at least one scan chain. The processor is further configured to determine, based on the dividing, whether each of the plurality of sections fail a data test. The determining includes interleaving the plurality of sections by scanning, via the processor, an alternating latch set from each scan chain in a first section, and scanning an alternating latch set from each scan chain in a second section.

According to yet other embodiments, a non-transitory computer-readable storage medium is described. The non-transitory storage medium may include program instructions that are executable by a processor to perform a method for testing a microelectronic chip. The method may include dividing, via a processor running a scanning engine, a plurality of sections of the microelectronic chip. Each of the plurality of sections includes at least two latch sets in at least one scan chain. The method may further include determining, via the processor, based on the dividing, whether each of the plurality of sections fail a data test. The determining comprises interleaving the plurality of sections by scanning, via the processor, an alternating latch set from each scan chain in a first section, and scanning an alternating latch set from each scan chain in a second section.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 1 depicts a block diagram of a computer system for use in practicing the teachings herein;

FIG. 2 depicts a block diagram of conventional multiple scan sections (MSS) with dedicated scan out paths;

FIG. 3 depicts a block diagram of a concatenated scan out path of a conventional multiple scan section;

FIG. 4 depicts a block diagram of a conventional system with multiple scan sections (MSS) using a section selection mechanism;

FIG. 5 depicts a block diagram of a bitwise rotating scan section according to one embodiment;

FIG. 6 depicts a flow diagram of a method for testing a microelectronic using a scan section rotating scan according to one embodiment;

FIG. 7 depicts a flow diagram of a method for determining whether a section fails a data test according to one embodiment;

FIG. 8 depicts a block diagram of a bitwise rotating scan section according to one embodiment;

FIG. 9 depicts a block diagram of a scan section rotation scan out path according to one embodiment;

FIG. 10 depicts a scan timing diagram of a conventional scan; and

FIG. 11 depicts a scan timing diagram of a scan timing diagram using a scan section rotating scan according to one embodiment.

DETAILED DESCRIPTION

FIG. 1 illustrates a block diagram of an exemplary computing environment and computer system 100 (hereafter "computer 100") for use in practicing the embodiments described herein. The methods described herein can be implemented in hardware, software (e.g., firmware), or a combination thereof. In an exemplary embodiment, the methods described herein are implemented in hardware, and may be part of the microelectronic of a special or general-purpose digital computer, such as a personal computer, workstation, minicomputer, or mainframe computer. Computer 100 therefore can embody a general-purpose computer. In another exemplary embodiment, the methods described herein are implemented as part of a mobile device, such as, for example, a mobile phone, a personal data assistant (PDA), a tablet computer, etc.

In an exemplary embodiment, in terms of hardware architecture, as shown in FIG. 1, the computer 100 includes processor 101. Computer 100 also includes memory 102 coupled to processor 101, and one or more input/output adapters 103 that may be communicatively coupled via system bus 105. Memory 102 may be operatively coupled to one or more internal or external memory devices via a storage interface 108. Communications adapter 116 may operatively connect computer 100 to one or more networks 106. System bus 105 may connect one or more user interfaces via input/output (I/O) adapter 103. I/O adapter 103 may connect a plurality of input devices 104 to computer 100. Input devices may include, for example, a keyboard, a mouse, a microphone, a sensor, etc. System bus 105 may also connect one or more output devices 107 via I/O adapter 103. Output device 107 may include, for example, a display, a speaker, a touchscreen, etc.

Processor 101 is a hardware device for executing hardware instructions or software, particularly that stored in a non-transitory computer-readable memory (e.g., memory 102). Processor 101 can be any custom made or commercially available processor, a central processing unit (CPU), a plurality of CPUs, for example, CPU 101a-101c, an auxiliary processor among several other processors associated with the computer 100, a semiconductor based microelectronic (in the form of a microchip or chip set), or generally any device for executing instructions. Processor 101 can include a cache memory 122, which may include, but is not limited to, an instruction cache to speed up executable instruction fetch, a data cache to speed up data fetch and store, and a translation lookaside buffer (TLB) used to speed up virtual-to-physical address translation for both executable instructions and data. Cache memory 122 may be organized as a hierarchy of more cache levels (L1, L2, etc.).

Processor 101 may be disposed in communication with one or more memory devices (e.g., RAM 109, ROM 110, one or more external databases 121, etc.) via a storage interface 108. Storage interface 108 may also connect to one or more memory devices including, without limitation, one or more databases 121, and/or one or more other memory drives (not shown) including, for example, a removable disc drive, etc., employing connection protocols such as serial advanced technology attachment (SATA), integrated drive electronics (IDE), IEEE-1394, universal serial bus (USB), fiber channel, small computer systems interface (SCSI), etc.

The memory drives may be, for example, a drum, a magnetic disc drive, a magneto-optical drive, an optical drive, a redundant array of independent discs (RAID), a solid-state memory device, a solid-state drive, etc. Variations of memory devices may be used for implementing, for example, a scan section fail log 121a.

Memory 102 can include random access memory (RAM) 109 and read only memory (ROM) 110. RAM 109 can be any one or combination of volatile memory elements (e.g., DRAM, SRAM, SDRAM, etc.). ROM 110 can include any one or more nonvolatile memory elements (e.g., erasable programmable read only memory (EPROM), flash memory, electronically erasable programmable read only memory (EEPROM), programmable read only memory (PROM), tape, compact disc read only memory (CD-ROM), disk, cartridge, cassette or the like, etc.). Moreover, memory 102 may incorporate electronic, magnetic, optical, and/or other types of non-transitory computer-readable storage media. Memory 102 may also be a distributed architecture, where various components are situated remote from one another, but can be accessed by processor 101.

The instructions in memory 102 may include one or more separate programs, each of which comprises an ordered listing of computer-executable instructions for implementing logical functions. In the example of FIG. 1, the instructions in memory 102 may include an operating system 111. Operating system 111 can control the execution of other computer programs and provides scheduling, input-output control, file and data management, memory management, and communication control and related services.

The instructions in memory 102 may further include application data 112, and a user interface 113.

Memory 102 may also include a microelectronic scanning engine 114, configured to cause processor 101 to divide and/or sample a plurality of sections of the microelectronic chip, where each of the plurality of sections includes at least one latch set in at least one scan chain. Microelectronic scanning engine 114 may further cause processor 101 to determine, based on the dividing, whether each of the plurality of sections fail a data test and write a scan section fail log 121a based on the scanning each of the alternating latch sets from the first and second sections. Microelectronic scanning engine 114 may instruct processor 101 to determine whether one or more of the sections fail the data test and select which scan chain in each of the plurality of sections to continue testing based on fail log 121a.

I/O adapter 103 can be, for example, but not limited to, one or more buses or other wired or wireless connections. I/O adapter 103 may have additional elements (which are omitted for simplicity) such as controllers, microelectronics, buffers (caches), drivers, repeaters, and receivers, which may work in concert to enable communications. Further, I/O adapter 103 may facilitate address, control, and/or data connections to enable appropriate communications among the aforementioned components.

I/O adapter 103 can further include a display adapter coupled to one or more displays. I/O adapter 103 may operatively connect one or more input/output (I/O) devices 107 to computer 100. For example, I/O 103 may connect a keyboard and mouse, a touchscreen, a speaker, a haptic output device, or other output device. Output devices 107 may include but are not limited to a printer, a scanner, and/or the like. Other output devices may also be included, although not shown. Finally, the I/O devices connectable to I/O adapter 103 may include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like.

According to some embodiments, computer 100 may include a mobile communications adapter 123. Mobile communications adapter 123 may include GPS, cellular, mobile, and/or other communications protocols for wireless communication.

In some embodiments, computer 100 can further include communications adapter 116 for coupling to a network 106.

Network 106 can be an IP-based network for communication between computer 100 and any external device. Network 106 transmits and receives data between computer 100 and devices and/or systems external to computer 100. In an exemplary embodiment, network 106 can be a managed IP network administered by a service provider. Network 106 may be a network internal to an aircraft, such as, for example, an avionics network, etc. Network 106 may be implemented in a wireless fashion, e.g., using wireless protocols and technologies, such as WiFi, WiMax, etc. Network 106 may also be a wired network, e.g., an Ethernet network, an ARINC 429 network, a controller area network (CAN), etc., having any wired connectivity including, e.g., an RS232 connection, R5422 connection, etc. Network 106 can also be a packet-switched network such as a local area network, wide area network, metropolitan area network, Internet network, or other similar type of network environment. The network 106 may be a fixed wireless network, a wireless local area network (LAN), a wireless wide area network (WAN) a personal area network (PAN), a virtual private network (VPN), intranet or other suitable network system.

Network 106 may operatively connect computer 100 to one or more devices including device 117, device 118, and device 120. Network 106 may also connect computer 100 to one or more servers such as, for example, server 119.

If computer 100 is a PC, workstation, laptop, tablet computer and/or the like, the instructions in the memory 102 may further include a basic input output system (BIOS) (omitted for simplicity). The BIOS is a set of essential routines that initialize and test hardware at startup, start operating system 111, and support the transfer of data among the operatively connected hardware devices. The BIOS is stored in ROM 110 so that the BIOS can be executed when computer 100 is activated. When computer 100 is in operation, processor 101 may be configured to execute instructions stored within the memory 102, to communicate data to and from the memory 102, and to generally control operations of the computer 100 pursuant to the instructions.

Today's chips are typically composed of multiple sections (also commonly called cores or chiplets). As described above, two conventional methods for testing a chip included a dedicated method, where each section uses dedicated pins on the test bus, and a Multiple Scan Sections (MSS) method, where the scan engine scans each section one at a time.

FIG. 2 depicts a dedicated scan system 200 that includes conventional scan sections 202, 204, and 206 with dedicated scan out paths 218, 222, and 224. Although FIG. 2 depicts only three scan sections 202, 204, and 206, it should be understood that additional scan sections (e.g., 16, 32, 64, etc.) may be implied with respect to the conventional examples of FIGS. 2-4.

Dedicated pin scanning may be advantageous from a determination of pass/fail and determining whether a scan section is partially good. When scan chains are balanced with respect to the total number of latches in scan chains 0-5 (latches not shown), the most effective way to scan the chip may be with multiple (dedicated) scan sections as shown in FIG. 2. Ideally, each section 202, 204, and 206 would have a scan length appropriate for the section tested. Scanning one section at a time, where each respective section serially scans each respective chain within that section through its dedicated pin, may also reduce power consumption because the whole chip is not simultaneously scanned.

However, due to imbalanced scan chains, which are often the case, methods including dedicated scan paths may be less than ideal with respect to tester time and tester memory. In a simple case where a chip scan bus is 32 channels wide and with 32 sections (FIG. 2 depicts 3 sections 202, 204, and 206 each having two scan chains), each of the 32 sections would use one of the 32 available scan channels 218. This method may have some advantages in that the entire chip is scanned together. Each scan out pin (e.g., scan out pins 212, 214, and 216) may provide failure response unique to the section on the respective scan channel, which may ease the formulation of a pass/fail analysis. But if scan chains are unbalanced, e.g., if some chains (e.g., chain 5) have 2000 latches, and other chains on the bus (e.g., chain 4) have 20,000 latches, etc., both of chains 4 and 5 would each fill the memory used for pass/fail data storage with 20,000 latches worth of pass/fail data. This is done regardless of whether a chain has only 2000 latches, 2 latches, or 20,000 latches. Accordingly, when an unbalanced scan chain has far fewer latches than other chains on that scan bus, the largest chain sets the memory usage for every other chain on the bus, and test memory is filled with useless data for the less-populated (smaller) chains.

FIG. 3 depicts a block diagram of a concatenated scan out path (scan bus) 302 of a conventional multiple scan sections (MSS) system 300. Using the second conventional system 300 may reduce power consumption for testing operations since the whole chip is not being scanned at once. Assuming the scan chains 0-5 for each respective section 304, 306, and 308 are balanced across the scan bus 302, MSS can be favorable from a tester time perspective. Using MSS, each section has full access to scan bus 302 and is scanned one at a time (e.g., starting with chain 5 through chain 0).

FIG. 4 depicts a block diagram of a scan out path of a conventional multiple scan section system 400. Some MSS systems, for example, conventional system 400, may scan multiple sections 402, 404, and 406 using a section select mechanism 408. Selection select mechanism 408 is often internally controlled within the chip. In other systems, selection select mechanism 408 is a controlled signal from an external source. Methods using single channel MSS such as systems 300 and 400 are limited by the amount of fail data that can be collected. When measuring one section at a time in concatenated scan bus, the sections scanned first (e.g., chain 4 and chain 5 with respect to system 300) can fill up the pass/fail data memory (not shown) limiting data available from the scanning of subsequent sections 0 and 1.

When using MSS, each section is scanned in its entirety. Instead of scanning each section in its entirety, it may be advantageous to scan n number of bits from each section (for example, by dividing each scan chain into subsets, each having a predetermined number of latches), thereby dividing each latch set before scanning the whole scan chain or section. By only scanning the first n number of latches in each latch set (for example, the first 4 latches in the latch set) it is possible to save tester time, decrease the memory needed to perform the testing, and decrease the likelihood of filling the fail data tester memory with unneeded and unusable data. It may also be advantageous to sequence through and scan 1 bit from each latch set, and after reaching a predetermined number of failing bits, categorize the section as a catastrophic fail and skip the scan chain or section on subsequent scans. It may also be beneficial to provide methods and systems configured to perform rotational scanning at the scan in or scan out busses.

FIG. 5 depicts a block diagram of a bitwise rotating scan section 500 (referred to hereafter as system 500), according to one embodiment. System 500 may include a processor 101 running a microelectronic scanning engine 114, as shown in FIG. 1. System 500 can include a section selector 512 operatively connected to a plurality of sections of a microelectronic under test (for example, a microelectronic containing sections 502, 504, and 506). Although 3 sections are shown, it is understood that system 500 may contain any number of sections configured to perform methods described herein.

Section selector 512 may be configured to divide sections 502, 504, and 506. Each section can include at least one scan chain 508. The scan chains (e.g., scan chain 508) may include a plurality of latch sets 510 that each include a predetermined number of latches. For example, latch set 510 may include 1 latch, 4 latches, 10 latches, 50 latches, 100 latches, etc. System 500 may be configured to interleave sections 502, 504, and 506 by interleaving latch sets from each scan chain in one or more scan out pins 514 and 516. Although only two scan out pins are depicted, it is appreciated that system 500 may include any number of scan out pins.

FIG. 6 depicts a flow diagram of a method 600 for testing a microelectronic using a scan section rotating scan, according to one embodiment. Referring now to FIG. 6, as shown in block 604, processor 101 may divide a plurality of sections 502, 504, and 506, where each of the plurality of sections includes at least one latch set (e.g., latch set 510) in at least one scan chain (e.g., scan chain 508).

As shown in block 606, processor 101 may determine, based on the dividing of the sections, whether each of the plurality of sections fail a data test. The data test may include, for example, determining whether one or more latches in latch set 510 registers and holds an intended value. Other tests are contemplated. According to some embodiments, scanning the sections can include dividing each section of the plurality of sections into one or more scan chains, where each of the one or more scan chains includes a plurality of latch sets. Each latch set may include one to four latches, or some other predetermined number of latches. FIG. 7 depicts a flow diagram of a method 700 for determining whether a section fails a data test according to one embodiment.

Referring briefly to FIG. 7, as shown in block 704, processor 101 may scan alternating latch sets (e.g., latch set 518 and latch set 520), from a first section (e.g., section 502).

As shown in block 706, processor 101 may interleave the plurality of sections by scanning an alternating latch set from a second section (e.g., scan chain in a second section 504). For example, as shown in FIG. 5, scan out pin 514 receives Set 0 (scan set 518), scan out pin 516 receives Set 1 (latch set 520), scan out pin 516 receives Set 2 from section 504 . . . etc. Accordingly, section selector 512 receives instructions from processor 101 to select each respective section, scan chain, set, and route the scan set to a scan out pin.

As shown in block 708, as depicted with respect to FIG. 5, processor 101 interleaves the first and second section scans of the latch sets from each scan chain in the first and second scan chains. Processor 101 may interleave latch sets from all sections on the microelectronic being tested (e.g., section 506, etc.).

At block 710, processor tests the latch sets to determine whether each latch set passes or fails.

According to some embodiments, processor 101 may be configured to divide the plurality of sections on either a scan input or a scan output. For example, Referring briefly to FIG. 9, section selector 902 may interleave sections 906 and 904 through scan input 908. Scanning engine 114 may implement timing logic (depicted in FIG. 9 as t1 and t2, the timing for which shown in further detail with respect to FIG. 11). As shown in FIG. 9, interleaved bits from section 1 906 and section 2 904 are tested along the scan bus 910.

Referring again to FIG. 7, after testing latch sets as shown in block 710, processor 101 may write a fail log based on the scanning each of the alternating latch sets from the first and second sections 502 and 504, whether one or more of the sections 502 and/or 504 fail the data test.

Referring again to FIG. 6, after determining whether sections fail the data test, as shown in block 606 and explained in detail with respect to FIG. 7, processor 101 may select scan chain(s) for continued testing, as shown in block 608. In some aspects, selecting the plurality of sections to continue testing includes selecting only passing chains by skipping, via the processor, a failing chain when a predetermined number of latches in the failing chain fail the data test. FIG. 8 depicts the bitwise rotating scan section depicted in FIG. 5 after discovering a failure in a latch set, according to one embodiment.

Referring briefly to FIG. 8, if processor 101 determines that one or more latches in a latch set fails, (e.g., processor 101 detects one or more defective latches in latch set 9, as shown in section 504) processor 101 may selectively skip only the failing chain(s) containing the break(s). In other embodiments, processor 101 may select sections 502 and 506 to continue testing based on the fail log's indication of a failed latch set in section 504. In some aspects, processor 101 may skip the entire section and stop on the first fail indication. In other aspects, processor 101 may wait until it encounters a predetermined number of failures (e.g., 3 failures) in a chain before selecting to skip that chain or section. According to yet other embodiments, processor 101 may only skip failing chains and continue to measure passing chains from all sections.

FIG. 10 depicts a scan timing diagram of a conventional scan, having a problem with timing. Referring briefly to FIG. 10, a timing problem is depicted where data is not getting to the intended pin in time. Here, the window for bit 0 and bit 1 is 1 clock cycle (vs. double the clock cycle needed for the data to timely arrive). In comparison, FIG. 11 depicts a scan timing diagram using a bitwise rotating scan section as described herein. As shown in FIG. 11, the timing solution depicted doubles the clock cycle allowing data to timely arrive.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method using hardware and/or firmware for testing a microelectronic chip comprising:
dividing, via a processor running a scanning engine, a plurality of scan chains into a plurality of sections of the microelectronic chip, wherein each of the plurality of sections comprises at least two latch sets in at least one scan chain, such that dividing comprises grouping each scan chain of a plurality of scan chains into subsets, each subset being a section having a predetermined number of latches; and determining, via the processor, based on the dividing, whether each of the plurality of sections fail a data test, wherein the determining comprises:

interleaving the plurality of sections by scanning, via the processor, an alternating latch set from each scan chain in a first section, and scanning an alternating latch set from each scan chain in a second section; and identifying a faulty scan chain based on the interleaved plurality of sections.

2. The computer-implemented method of claim 1, wherein determining further comprises:

writing, via the processor, a fail log based on the scanning each of the alternating latch sets from the first and second sections, whether one or more of the plurality of sections fail the data test; and selecting, via the processor, which scan chain in each of the plurality of sections to continue testing based on the fail log.

3. The computer-implemented method of claim 1, wherein dividing the plurality of sections comprises dividing each section of the plurality of sections into one or more scan chains, wherein each of the one or more scan chains comprises a plurality of latch sets, each latch set comprising one to four latches.

4. The computer-implemented method of claim 1, wherein interleaving the plurality of sections comprises scanning, via the processor, between one and four latches in each respective latch set.

5. The computer-implemented method of claim 1, wherein interleaving the sections comprises scanning, via the processor, three or more sections.

6. The computer-implemented method of claim 1, wherein selecting the plurality of sections to continue testing comprises:

selecting, via the processor, only passing chains by skipping, via the processor, a failing chain when a predetermined number of latches in the failing chain fail the data test; and selecting only passing sections by skipping, via the processor, a section containing a failing chain.

7. The computer-implemented method of claim 1, wherein the processor is configured to sample the plurality of sections on either a scan input or a scan output.

8. A system for testing a microelectronic chip comprising:
a processor configured to implement a scanning engine, the scanning engine configured to:

sample a plurality of sections of the microelectronic chip, wherein each of the plurality of sections comprises at least one latch set in at least one scan chain;

dividing a plurality of scan chains into a plurality of sections of the microelectronic chip, wherein each of the plurality of sections comprises at least two latch sets in at least one scan chain, such that dividing comprises grouping each scan chain of a plurality of scan chains into subsets, each subset being a section having a predetermined number of latches; and determine, based on the dividing, whether each of the plurality of sections fail a data test, wherein the determining comprises:

interleave the plurality of sections by scanning, via the processor, an alternating latch set from each scan chain in a first section, and scanning an alternating latch set from each scan chain in a second section; and identify a faulty scan chain based on the interleaved plurality of sections.

9. The system of claim 8, further comprising:

writing, via the processor, a fail log based on the scanning each of the alternating latch sets from the first and second sections, whether one or more of the plurality of sections fail the data test; and select which scan chain in each of the plurality of sections to continue testing based on the fail log.

10. The system of claim 8, wherein the processor is configured to divide each section of the plurality of sections into one or more scan chains, wherein each of the one or more scan chains comprises a plurality of latch sets, each latch set comprising one to four latches, and sample the plurality of sections.

11. The system of claim 8, wherein the processor is configured to interleave the plurality of sections by scanning between one and four latches in each respective latch set.

12. The system of claim 8, wherein the processor is configured to interleave the sections by scanning three or more sections.

13. The system of claim 8, wherein the processor is configured to:

select only passing chains by skipping a failing chain when a predetermined number of latches in the failing chain fail the data test; and select only passing sections by skipping, via the processor, a section containing a failing chain.

14. The system of claim 8, wherein the processor is configured to sample the plurality of sections on either a scan input or a scan output.

15. A computer program product for testing a microelectronic chip, the computer program product comprising a computer readable storage medium having program instructions embodied therewith, wherein the computer readable storage medium is not a transitory signal per se, the program instructions executable by a processor running a scanning engine to cause the processor to perform a method comprising:

dividing, via the processor, a plurality of sections of the microelectronic chip, wherein each of the plurality of sections comprises at least one latch set in at least one scan chain, such that dividing comprises grouping each scan chain of a plurality of scan chains into subsets, each subset being a section having a predetermined number of latches; and determining, via the processor, based on the dividing, whether each of the plurality of sections fail a data test, wherein the determining comprises:

interleaving plurality of sections by scanning, via the processor, an alternating latch set from each scan chain in a first section, and scanning an alternating latch set from each scan chain in a second section; and identifying a faulty scan chain based on the interleaved plurality of sections.

16. The computer program product of claim 15, wherein the method further comprises:

writing, via the processor, a fail log based on the scanning each of the alternating latch sets from the first and second sections, whether one or more of the plurality of sections fail the data test; and selecting, via the processor, which scan chain in each of the plurality of sections to continue testing based on the fail log.

17. The computer program product of claim 15, wherein dividing the plurality of sections comprises dividing each section of the plurality of sections into one or more scan chains, wherein each of the one or more scan chains comprises a plurality of latch sets, each latch set comprising one to four latches.

18. The computer program product of claim 15, wherein interleaving the plurality of sections comprises scanning, via the processor, between one and four latches in each respective latch set.

19. The computer program product of claim 15, wherein interleaving the sections comprises scanning, via the processor, three or more sections.

20. The computer program product of claim 15, wherein selecting the plurality of sections to continue testing comprises:

selecting only passing chains by skipping, via the processor, a failing chain when a predetermined number of latches in the failing chain fail the data test; and selecting the plurality of sections to continue testing comprises selecting only passing sections by skipping, via the processor, a section containing a failing chain; and wherein selecting the plurality of sections to continue testing comprises selecting only passing sections by skipping, via the processor, a section containing a failing chain.

* * * * *